United States Patent [19]

Yomogihara et al.

[11] Patent Number: 5,737,053
[45] Date of Patent: Apr. 7, 1998

[54] WIRE SUBSTRATE HAVING BRANCH LINES PERPENDICULAR TO THE MAIN LINES IN WHICH THE BRANCH LINES CONNECT TO DRIVING CIRCUITS ON A DISPLAY DEVICE

[75] Inventors: Yoshikazu Yomogihara; Ikue Yoshida, both of Tokyo, Japan

[73] Assignee: Kabushiki Kaisha Toshiba, Kawasaki, Japan

[21] Appl. No.: 658,267

[22] Filed: Jun. 5, 1996

[30] Foreign Application Priority Data

Jun. 5, 1995 [JP] Japan ................................. 07-137756
Apr. 2, 1996 [JP] Japan ................................. 08-80074

[51] Int. Cl.$^6$ ................. G02F 1/1345; H05K 1/00; H01R 9/09
[52] U.S. Cl. ................. 349/149; 349/150; 349/151; 361/749; 439/67; 439/77
[58] Field of Search ................. 174/72 A, 254, 174/255, 260; 439/67, 77; 361/749; 349/149, 150, 151, 152, 158, 160

[56] References Cited

U.S. PATENT DOCUMENTS 3,214,725 10/1965 De Rose et al. ................. 439/67
4,831,278 5/1989 Ueda et al. ................. 174/72 A
4,955,695 9/1990 Kubo et al. ................. 349/151
5,349,226 9/1994 Kawaguchi et al. ................. 349/152
5,563,445 10/1996 Iijima et al. ................. 257/698

FOREIGN PATENT DOCUMENTS 3-231488 10/1991 Japan ................. 439/67
5-107551 4/1993 Japan .

*Primary Examiner*—William L. Sikes
*Assistant Examiner*—Walter Malinowski
*Attorney, Agent, or Firm*—Cushman Darby & Cushman IP Group of Pillsbury Madison & Sutro LLP

[57] ABSTRACT

There is provided a liquid crystal display device in which the area of a peripheral portion of the glass substrate can be reduced and which can be packaged easily. Three X-side IC chips 22 are directly mounted to a peripheral portion 18 of a glass substrate 14 that constitutes a display portion 16 of a liquid crystal display device 10. Pads 27 for the X-side IC chips 22 are disposed between the X-side IC chips 22. A branch region 32 projecting from a main region 30 of a flexible substrate 28 is disposed between the X-side chips 22. Terminals 38 provided in the branch region 32 are electrically connected to the pads 27.

18 Claims, 15 Drawing Sheets

WIRE SUBSTRATE HAVING BRANCH LINES PERPENDICULAR TO THE MAIN LINES IN WHICH THE BRANCH LINES CONNECT TO DRIVING CIRCUITS ON A DISPLAY DEVICE

BACKGROUND OF THE INVENTION

1. Field of the Invention

The present invention relates to a display device and an IC chip used in the same and, more particularly, to a wiring and packaging structure of a display device using a chip-on-glass technique wherein IC chips are directly mounted on an insulating substrate such as a glass substrate or which includes driving circuits integrally formed therewith.

2. Description of the Related Art

Wiring and packaging structures of conventional liquid crystal display devices will be described with reference to FIG. 14 and FIG. 15.

A first wiring and packaging structure will be described with reference to FIG. 14.

A liquid crystal display device 100 includes a combination of two glass substrates 110 and 120, and a plurality of IC chips 140 are mounted to the periphery of one of the glass substrates 120 to be used for a signal line driving portion for driving switching devices such as thin film transistors (TFT's) formed on the glass substrate 120. The connection of signal lines for purposes such as the input of a power supply to the IC chips 140 and interconnection between the IC chips 140 is provided by thin film lines 170 formed on a peripheral portion 150 of the glass substrate 120 of the liquid crystal display device 100 and a flexible substrate 160 provided at an input terminal portion for the lines 170.

However, the first wiring and packaging structure has had a problem in that the peripheral portion 150 of the glass substrate 120 occupies a large area and in that the lines 170 which are thin film lines produced by the same process as for TFT's result in high wiring resistance.

A second wiring and packaging structure will be described with reference to FIG. 15.

A flexible substrate 160 is provided at a peripheral portion 150 of a glass substrate 120 of a liquid crystal display device 100 and is connected to a series of terminals connected to the terminals of IC chips 140.

However, the second wiring and packaging structure also has had a problem in that the peripheral portion 150 of the liquid crystal display device 100 is large because the flexible substrate 160 is connected to the IC chips 140 mounted to the peripheral portion 150 from the outside.

Taking the above-described situation into consideration, a liquid crystal display device 200 as shown in FIG. 16 has been proposed (Japanese unexamined patent publication (KOKAI) No. H5-107551).

It has a structure in which a plurality of IC chips 240 and connection terminals of the IC chips 240 are arranged on a straight line and a flexible substrate 260 is disposed in an overlapping relationship with the terminals and the IC chips 240.

This structure allows the area of a peripheral portion 250 of a glass substrate 220 to be reduced because the flexible substrate 260 is simply disposed in an overlapping relationship with the terminals and the IC chips 240.

However, this structure has had a problem in that operations to connect the flexible substrate 260 and the terminals become complicated after the flexible substrate 260 is overlapped with the IC chips 240 and the terminals, thereby increasing the difficulty of the assembly process.

The present invention has been conceived taking the above-described problems into consideration, and it is an object of the invention to provide a display device in which the area of a peripheral portion of a glass substrate can be reduced and which can be packaged easily.

SUMMARY OF THE INVENTION

According to a first aspect of the present invention, there is provided a display device including a display panel, a plurality of driving circuit portions mounted along at least one side of the display panel, and a wiring substrate for supplying a drive signal to the driving circuit portions, wherein the display panel includes a plurality of pads electrically connected to one of the driving circuit portions and disposed between the one of the driving circuit portions and another driving circuit portion; the wiring substrate includes a main region extending along the periphery of the one side of the display panel and a branch region extending from the main region and between the one of the driving circuit portions and the other driving circuit portion; a group of main lines constituted by a plurality of main lines are provided in the main region; and a branch line connected to at least one of the main lines is provided in the branch region; and the branch region includes a terminal electrically connected to the branch line and disposed between a position associated with the pads.

The display device according to the first aspect of the invention will now be described.

The branch region of the wiring substrate is disposed between the driving circuit portions, and the terminal provided in the branch region is electrically connected to the pads of the driving circuit portions.

As a result, the connection between the wiring substrate and the driving circuit portions is provided between the two driving circuit portions without a need for any area projecting to the peripheral portion. This makes it possible to provide the peripheral portion with a small area. Further, wiring is carried out simply by connecting the terminal in the branch region to the pads electrically.

A display device according to a second aspect of the invention is a display device according to the first aspect, wherein the display panel includes a plurality of pixel electrodes disposed through switching devices connected to signal lines and scan lines and wherein the driving circuit portions are connected to at least one of the signal lines.

In the display device according to the second aspect, the area of a peripheral portion of the display panel on the side of the signal lines can be small.

A display device according to a third aspect of the invention is a display device according to the first aspect, wherein the display panel includes a plurality of pixel electrodes disposed through switching devices connected to signal lines and scan lines and wherein the driving circuit portions are connected to at least one of the scan lines.

In the display device according to the third aspect, the area a peripheral portion of the display panel on the side of the scan lines can be small.

A display device according to a fourth aspect of the invention is a display device according to the first aspect, wherein the plurality of pads are arranged in the direction in which the branch region of the wiring substrate extends.

In the display device according to the fourth aspect, the connection between the pads and terminals can be provided easily because the plurality of pads are arranged in the direction in which the branch region extends.

A display device according to a fifth aspect of the invention is a display device according to the first aspect, wherein the plurality of pads are two-dimensionally interspersed.

In the display device according to the fifth aspect, the plurality of pads can be provided in a minimal area even if the number of pads is increased because they are two-dimensionally interspersed.

A display device according to a sixth aspect of the invention is a display device according to the first aspect, wherein the plurality of pads form two or more groups of pads arranged in the direction in which the branch region extends.

In the display device according to the sixth aspect, the arrangement of the plurality of pads into two groups allows them to be connected to the terminals easily.

A display device according to a seventh aspect of the invention is a display device according to the first aspect, wherein the plurality of pads are arranged at a predetermined angle to the direction in which the branch region extends.

In the display device according to the seventh aspect, the arrangement of the plurality of pads at a predetermined angle to the direction in which the branch region extends allows them to be connected to the terminals easily.

A display device according to an eighth aspect of the invention is a display device according to the first aspect, wherein part of the plurality of pads are disposed at a predetermined distance from the driving circuit portions and the remainder of the plurality of pads are disposed at a distance from the driving circuit portions different from the aforesaid predetermined distance.

In the display device according to the eighth aspect, the connection between the pads and terminals can be provided easily.

A display device according to a ninth aspect of the invention is a display device according to the first aspect, wherein the plurality of terminal associated with the plurality of pads form two or more groups of terminals arranged in the direction in which the branch region extends.

In the display device according to the ninth aspect, the formation of the two or more groups of terminals arranged in the direction in which the branch region extends allows the terminals to be connected to the pads easily.

A display device according to a tenth aspect of the invention is a display device according to the first aspect, wherein an insulation layer is interposed between the branch line in the branch region and main lines in the main region.

In the display device according to the tenth aspect, the insulation layer interposed between the branch line and the main lines allows fine wiring.

A display device according to an eleventh aspect of the invention is a display device including a display panel, a first driving circuit portion mounted along one side of the display panel, a second driving circuit portion mounted along another side of the display panel adjacent to the aforesaid side, and a wiring substrate for supplying a drive signal to each of the first and second driving circuit portions, wherein the wiring substrate includes a first main region extending along the aforesaid one side of the display panel, a second main region extending along the other side, a first branch region extending from the first main region in a direction substantially perpendicular to the one side and electrically connecting with the first driving circuit portion, and a second branch region extending from the second main region in a direction substantially perpendicular to the other side and electrically connecting with the second driving circuit portion.

In the display device according to the eleventh aspect, the first and second main regions are formed along two adjoining sides of the display panel, and the electrical connection of each of the driving circuit portions can be provided by the first and second branch regions provided on the respective main regions.

A display device according to a twelfth aspect of the invention is a display device according to the eleventh aspect, wherein the display panel includes a plurality of pads electrically connected to the first driving circuit portion; a group of main lines constituted by a plurality of main lines is provided in the first main region of the wiring substrate; a branch line electrically connected to at least one of the main lines is provided in the first branch region; and the branch line includes a terminal electrically connected to the branch line and disposed in a position associated with the pads.

In the display device according to the twelfth aspect, the terminal provided in the first branch region can be easily electrically connected to the pads of the first driving circuit portion.

A driving circuit portion according to a thirteenth aspect of the invention is a driving circuit portion used in a display including connection bumps arranged along each side of one substantially square principal surface thereof for outputting drive signals and control signals based on input signals including control signals, wherein a plurality of first bumps arranged along one side of the principal surface are bumps for outputting the drive signals; a plurality of second bumps arranged along a side adjacent to the aforesaid side are bumps for inputting the input signals; and a plurality of third bumps arranged along another side adjacent to the aforesaid side are bumps for outputting control signals.

In the driving circuit portion according to the thirteenth aspect, if the first bumps are provided on the side of the display panel and a branch region is provided for the second and third bumps, those bumps can be easily connected.

A driving circuit portion according to a fourteenth aspect of the invention is a driving circuit portion according to the thirteenth aspect, wherein a plurality of fourth bumps arranged along the side opposite to the aforesaid side are dummy bumps.

In the driving circuit portion according to the fourteenth aspect, the fourth bumps as dummy bumps allows the driving circuit portions to be supported by four groups of bumps for stable mounting on the display panel.

In a display device according to the present invention, the branch region of the wiring substrate is provided between driving circuit portions, and the terminals and pads are connected. As a result, the external connection of the driving circuit portions can be easily provided.

This eliminates a need for forming wiring outside the IC chip and therefore allows the peripheral portion of the display panel to be made small.

Further, the wiring of the driving circuit portions on the display panel can be provided by the wiring substrate. This allows the resistance of the wiring to be smaller than that in wiring using a thin film and allows the display device to be made larger.

Furthermore, no extra wiring is needed on the display panel. This simplifies wiring and reduces the area required for wiring.

In addition, the connection simply provided by connecting the pads and terminals facilitates packaging operations.

DETAILED DESCRIPTION OF THE PREFERRED EMBODIMENTS

A first embodiment of the present invention will be described with reference to FIGS. 1 through 8.

Figure 1:
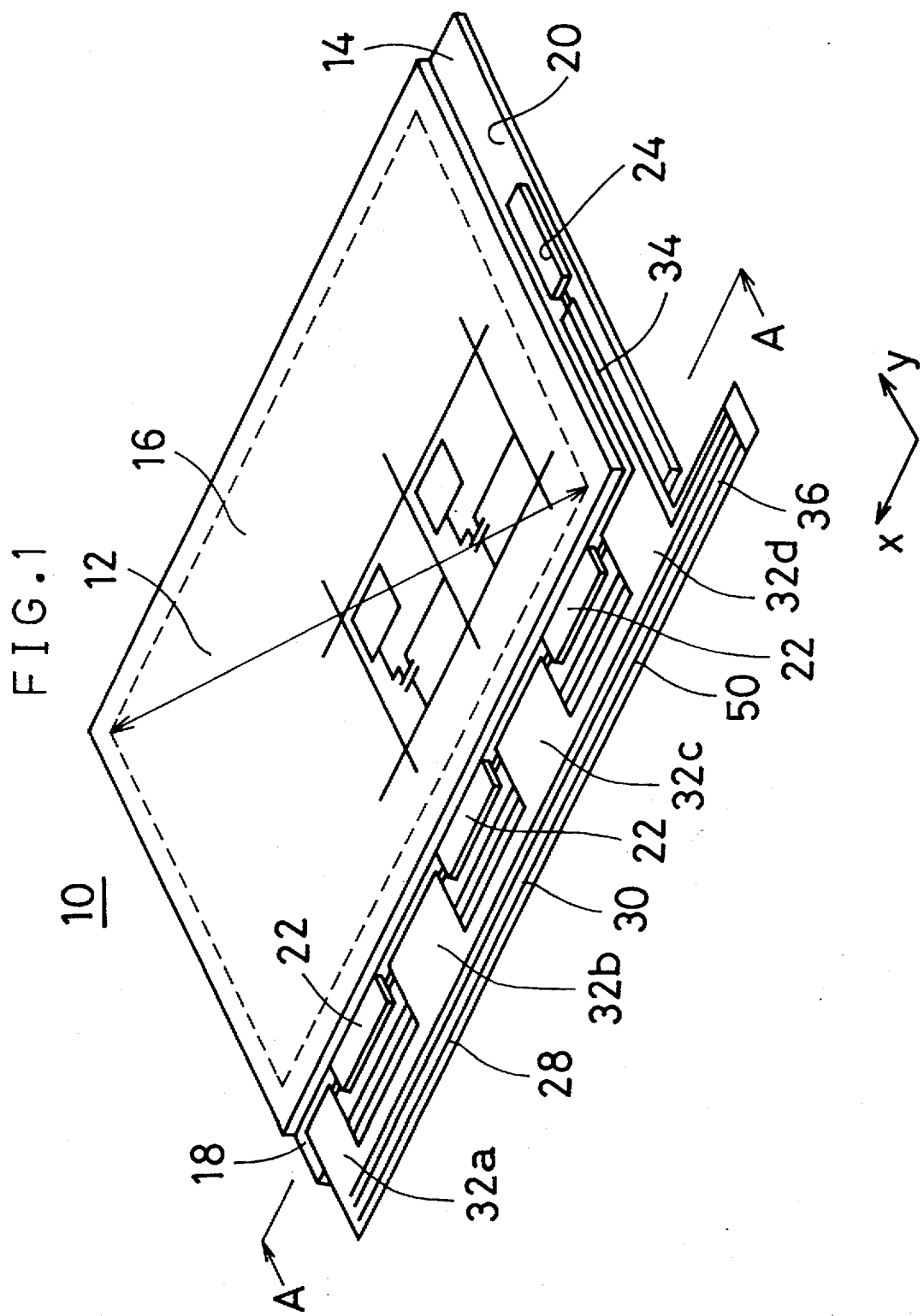
FIG. 1 is a perspective view of a liquid crystal display device illustrating a first embodiment of the present invention.

Referring to FIG. 1, the reference number 10 designates an active matrix type liquid crystal display device having a chip-on-glass structure in which a pair of electrode substrates 12 and 14 are combined with an orientation film and a liquid crystal layer interposed therebetween to form a display portion 16. The area of the display portion 16 indicated by the arrow is a display area. One of the electrode substrate 14 is formed to be larger than the other electrode substrate 12 and has a peripheral portion on the side of a signal line driving portion (hereinafter referred to as "X-side peripheral portion") 18 and a peripheral portion on the side of a gate line driving portion (hereinafter referred to as "Y-side peripheral portion") 20 formed thereon. In the following description, "x-direction" means a direction in parallel with the X-side peripheral portion while "y-direction" means a direction in parallel with the Y-side peripheral portion.

Although not illustrated, on the electrode substrate 14 which is a glass substrate, there is provided a plurality of signal lines in parallel with each other led out at the X-side peripheral portion 18, a plurality of scan lines in parallel with each other led out at the Y-side peripheral portion 20 which are perpendicular to the signal lines; a TFT disposed in the vicinity of the intersection of each signal line and scan line which is electrically connected to the scan line and signal line at the gate and drain electrodes thereof, respectively; and pixel electrodes constituted by transparent electrodes to which the source electrodes of the TFT's are electrically connected. The signal lines, scan lines, gate electrodes, source electrodes, and drain electrodes are films formed from low-resistance metal materials such as aluminum (Al), aluminum alloys, molybdenum-tungsten (Mo—W) alloys having a thickness on the order of several thousand angstroms using a thin film process such as sputtering.

On the electrode substrate 12 which is a glass substrate, there is provided a color filter having a colored portion associated with each pixel electrode for achieving color display and counter electrodes constituted by transparent electrodes disposed thereon.

The reference number 22 designates IC chips for driving signal lines directly mounted to the X-side peripheral portion 18 (hereinafter referred to as "X-side IC chips"). Three IC chips 22 are mounted on the glass substrate 14 at predetermined intervals.

Figure 3:
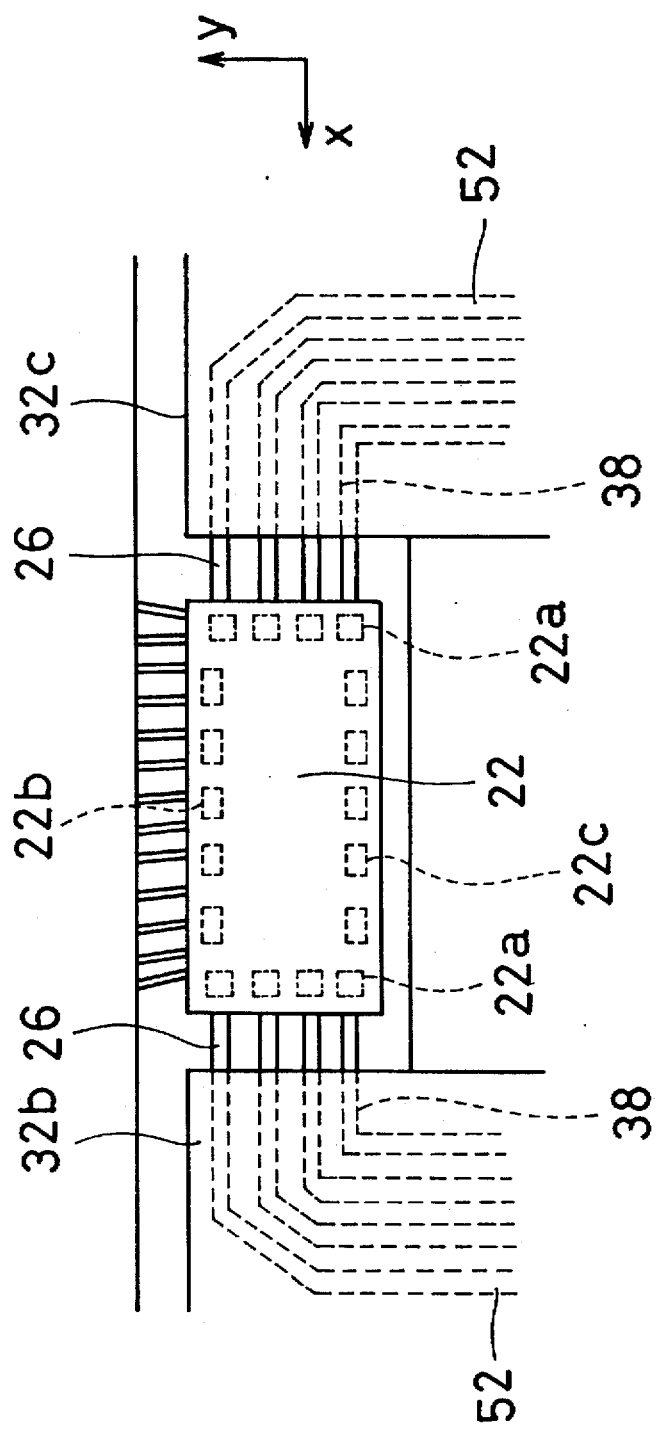
FIG. 3 is an enlarged plan view of major parts of FIG. 1.
Figure 4:
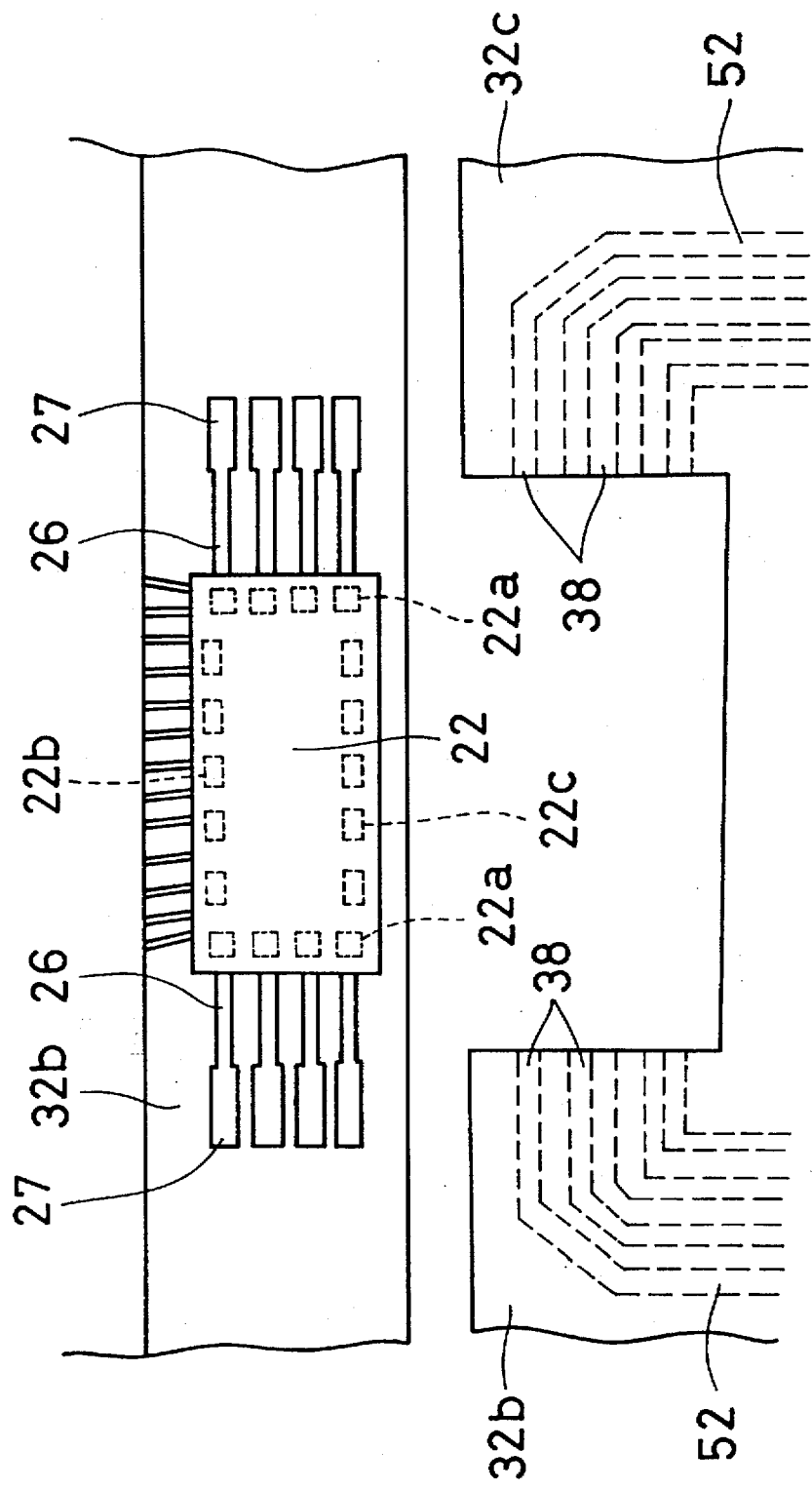
FIG. 4 is a plan view showing a state wherein a wiring substrate has been removed from a glass substrate.

As shown in FIG. 3, each of the X-side IC chips 22 is planar and rectangular. An X-side IC chip 22 has a plurality of bumps 22a on both shorter sides thereof for inputting signals and exchanging signals with other IC chips. It has a plurality of bumps 22b connected to signal lines provided on the inner longer side thereof which faces the display portion 16. A plurality of dummy bumps 22c are provided on the outer longer side.

Figure 2:
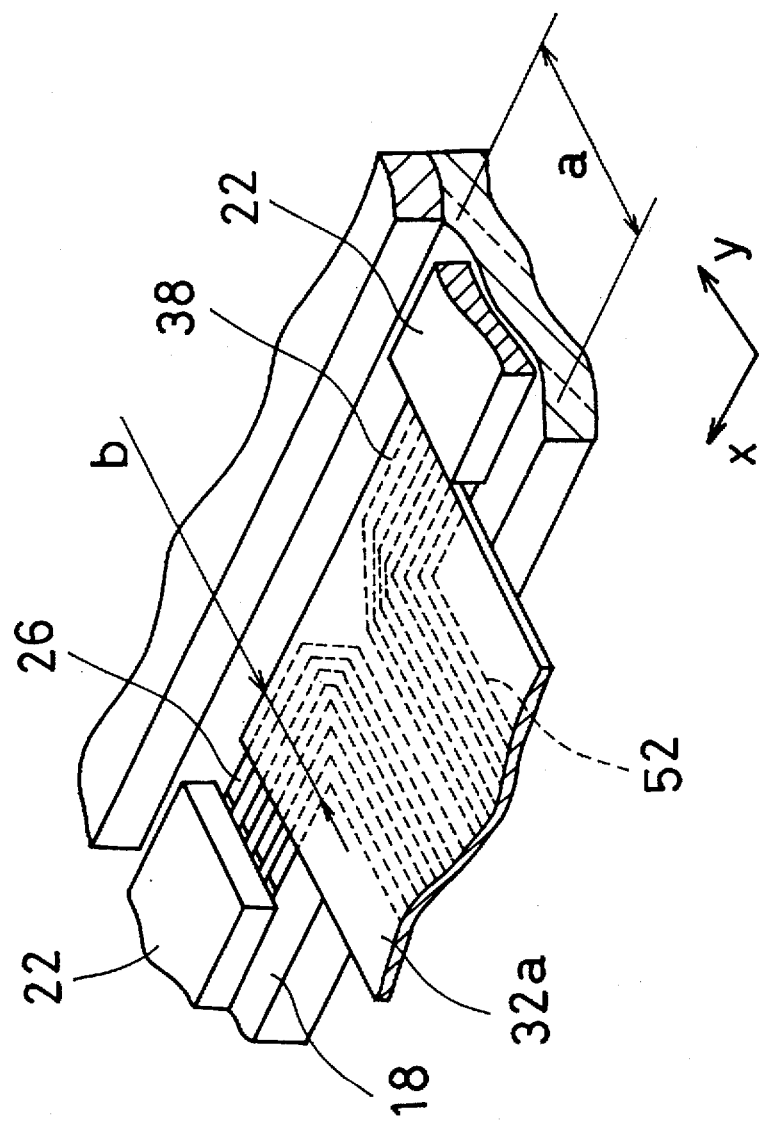
FIG. 2 is an enlarged perspective view of major parts of FIG. 1.
Figure 5:
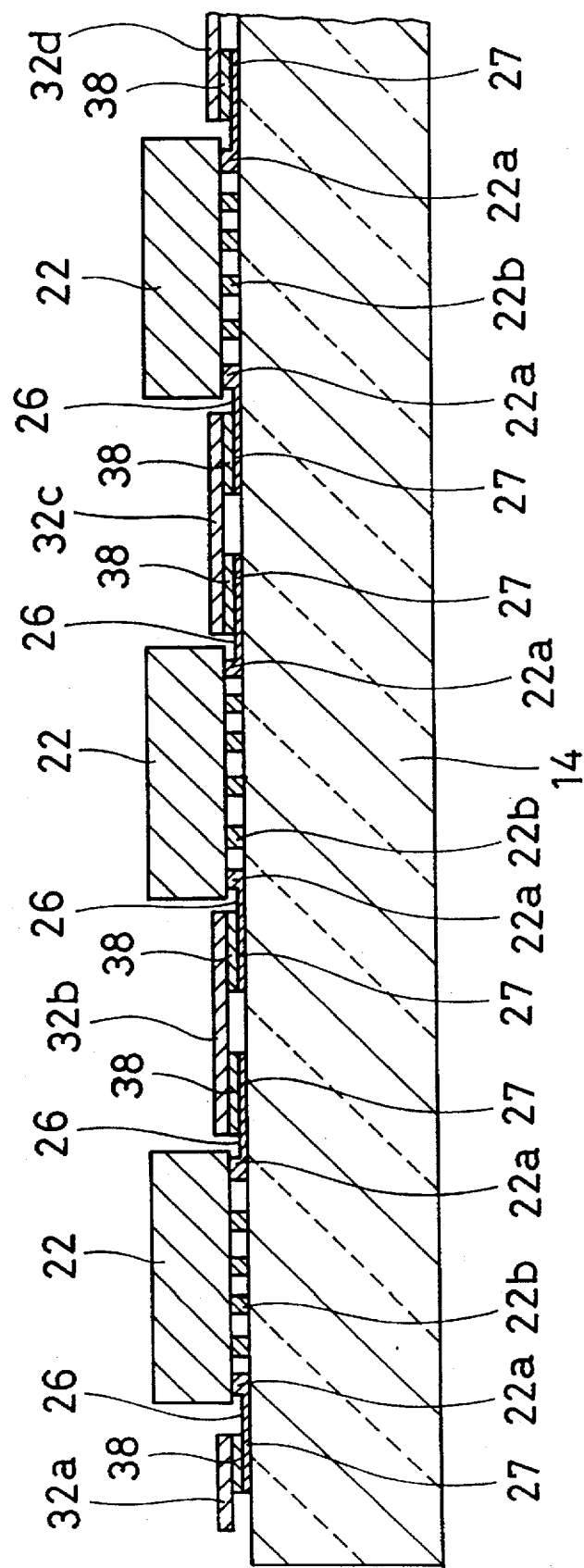
FIG. 5 is a sectional view taken along the line A—A in FIG. 1.

The reference number 27 designates a plurality of pads which are provided between the X-side IC chips 22 and are outside of mounting areas of the X-side IC chips 22 departing from both sides of the shorter sides thereof and which are respectively connected to the plurality of bumps 22a of the X-side chips 22 through lead wires 26 as shown in FIG. 5. For example, the plurality of pads 27 and lead wires 26 are formed using the same process as that for forming the signal lines. The plurality of pads 27 are arranged in parallel with the shorter sides of the X-side IC chips, i.e., in the y-direction. The pads 27 are arranged in a width "b" which is equal to or smaller than an area width "a" required for mounting the X-side IC chips 22 which are directly mounted to the X-side peripheral portion 18 of the glass substrate 14 as shown in FIG. 2.

In FIG. 1, the reference number 24 designates an IC chip on the side of a gate line driving portion (hereinafter referred to as "Y-side IC chip") directly mounted to the glass substrate 14 substantially in the middle of the Y-side peripheral portion 20.

The reference number 28 designates a wiring substrate, i.e., a flexible wiring substrate, for electrically connecting external input signal lines to the IC chips and connecting the IC chips to each other. The flexible wiring substrate 28 consists of a main region 30, and branch regions 32a, 32b, 32c, and 32d extending inwardly, i.e., in the y-direction. A gate line substrate 34 for the gate line driving portion projects from the branch region 34d. An external connection region 36 is provided in the main region 30 for providing connection to external circuits.

The flexible substrate 28 is formed from a synthetic resin material such as polyimide.

Eighteen main lines 50 are provided on the surface of the main region 30 in the longitudinal direction thereof, i.e., in the x-direction. The eighteen main lines 50 are formed of copper film. The inner main line 50, i.e., one located on the side of the display portion 16, is a power supply line. The outermost one is a start pulse signal line. A clock signal line, a ground line, and a plurality of data lines are located between the power supply line and the start pulse signal line.

The main lines 50 are electrically connected to external circuits and the like in the external connection region 36.

Figure 6:
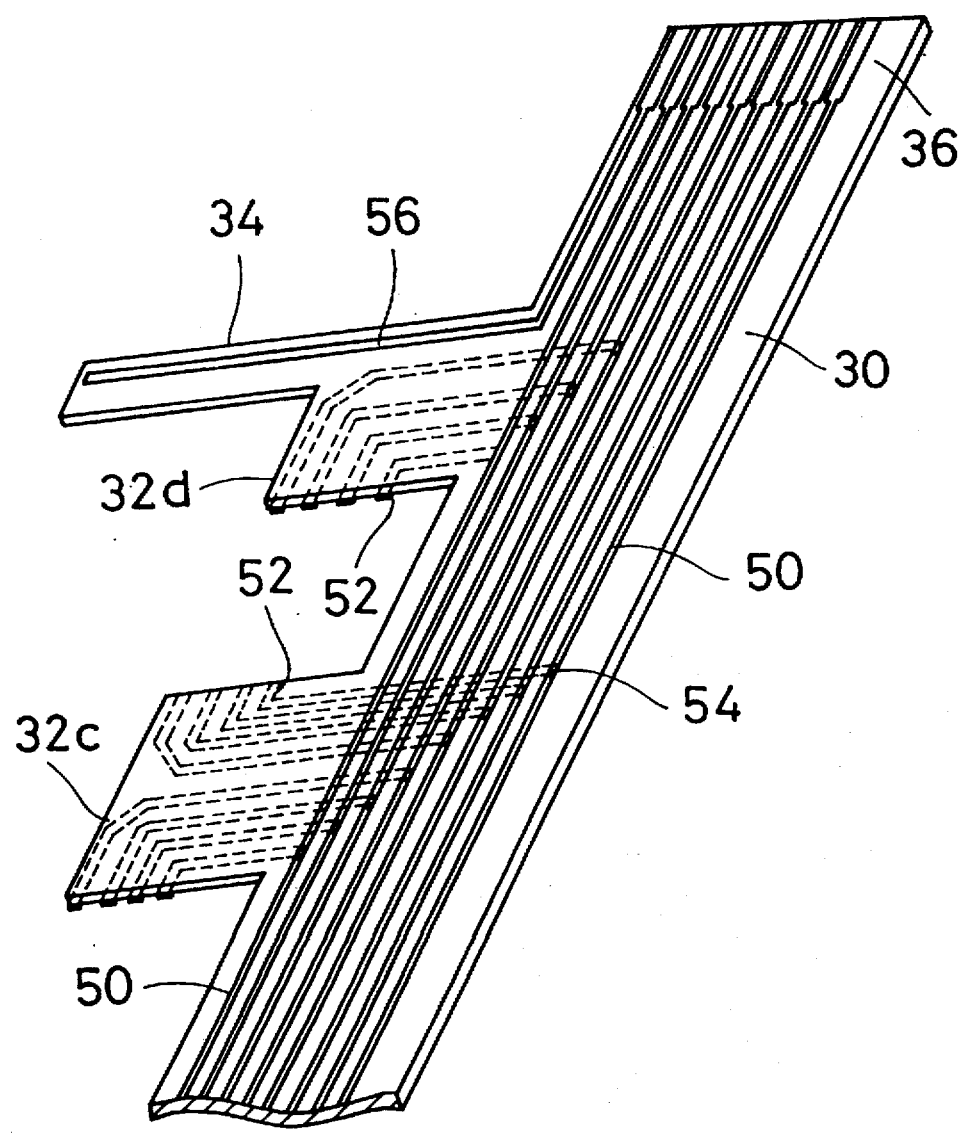
FIG. 6 is a perspective view of a flexible substrate.

Eighteen branch lines 52 are provided on the rear side of the branch region 32a as shown in FIGS. 3 and 6. The branch lines 52 are electrically connected to the respective main lines 50 in the main region 30 through contact holes 54.

Figure 7:
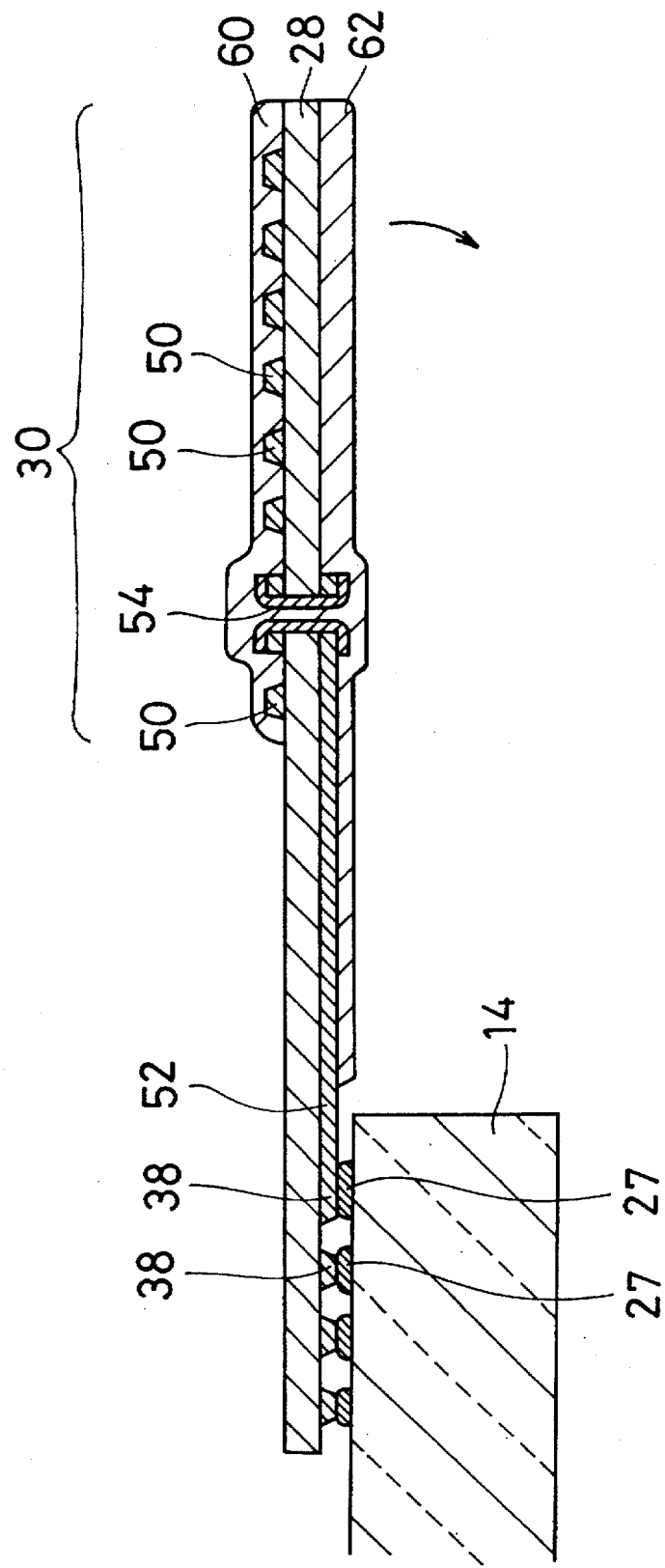
FIG. 7 is a longitudinal sectional view showing a state wherein a flexible substrate is mounted on a glass substrate.
Figure 8:
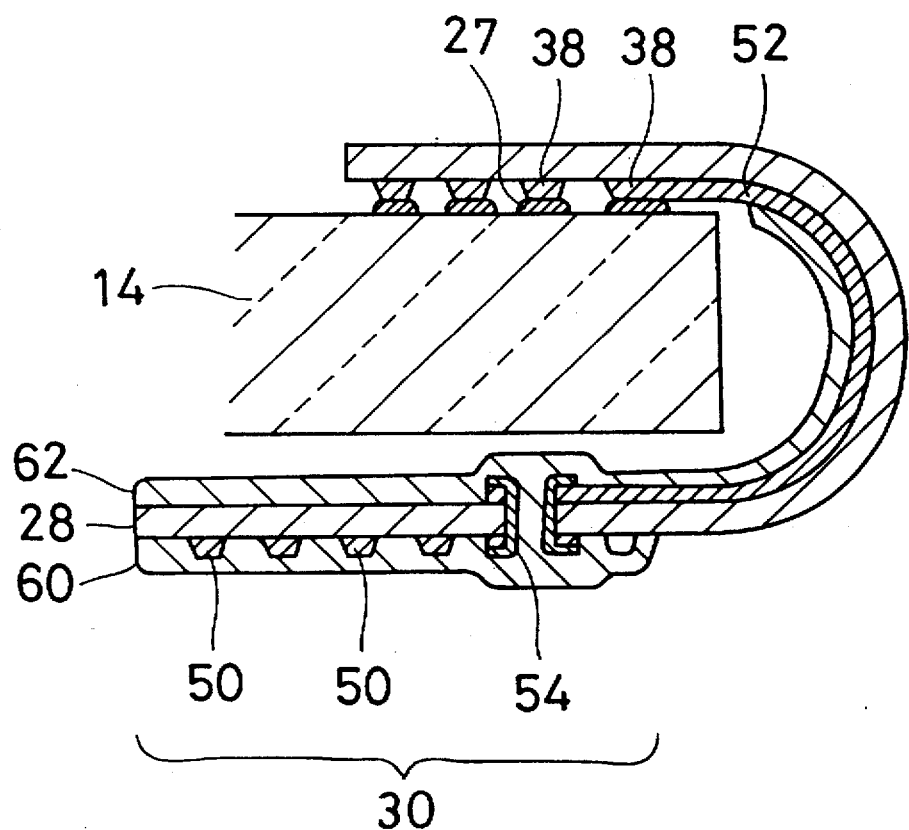
FIG. 8 is a longitudinal view showing a state wherein a flexible substrate is bent along a side edge of a glass substrate.

Each of the branch lines 52 is routed in the direction in which the branch region 32a extends, i.e., in the y-direction and then bent in the form of "L" toward the X-side IC chips 22 to be routed in the x-direction as shown in FIGS. 7 and 8. A terminal 38 is provided at the end of each branch line 52 to allow it to be connected to a pad 27. The terminals 38 are arranged along the edge of the branch region 32a, i.e., in the y-direction as shown in FIG. 2.

Although the branch lines 52 in the branch region 32b have the same wiring structure as that in the branch region 32a as shown in FIG. 2, a forked structure is employed to route them to two X-side IC chips 22.

As shown in FIG. 7, the main lines 50 and branch lines 52 are provided with a polyimide layer that constitutes the flexible substrate 28 interposed therebetween. As a result, they are electrically insulated from each other. An adequate thickness of this polyimide layer is about 25 μm. Protective layers 60 and 62 are provided to protect the main lines 50 and branch lines 52, respectively. The protective layers 60 and 62 are also preferably formed from polyimide.

Lines 56 for driving gate lines are provided on the surface of the gate line substrate 34.

Terminals are also provided at the end of each lines 56 for gate lines to allow each of them to be connected to the Y-side IC chip 24.

A description will now be made on the connection of the flexible substrate 28 to the X-side IC chips 22 and Y-side IC chip 24 in the liquid crystal display device having the above-described configuration.

(1) The main region 30 of the flexible substrate 28 is positioned externally to the X-side peripheral portion 18, and the branch regions 32b and 32c are positioned between the X-side IC chips 22.

(2) The terminals 38 and pads 27 are overlapped and electrically connected with each other. The terminals of the gate line substrate 34 are connected to the Y-side IC chip 24.

Since the plurality of pads 27 are arranged in the direction in which the branch regions 32 extend, i.e. in the y-direction, they can be easily aligned and connected to the terminals 38 because of positional correspondence therebetween.

(3) The flexible substrate 14 is folded at the branch regions along the side edge of the glass substrate 14 as shown in FIG. 8, so that the main region 30 of the flexible substrate 28 which projects from the glass substrate 14 shown in FIG. 7 is positioned on the rear side of the glass substrate 14. As a result, the width of the X-side peripheral portion 18 of the display portion 16 can be made substantially equal to the width of the mounting area of the X-side IC chips 22.

Figure 9:
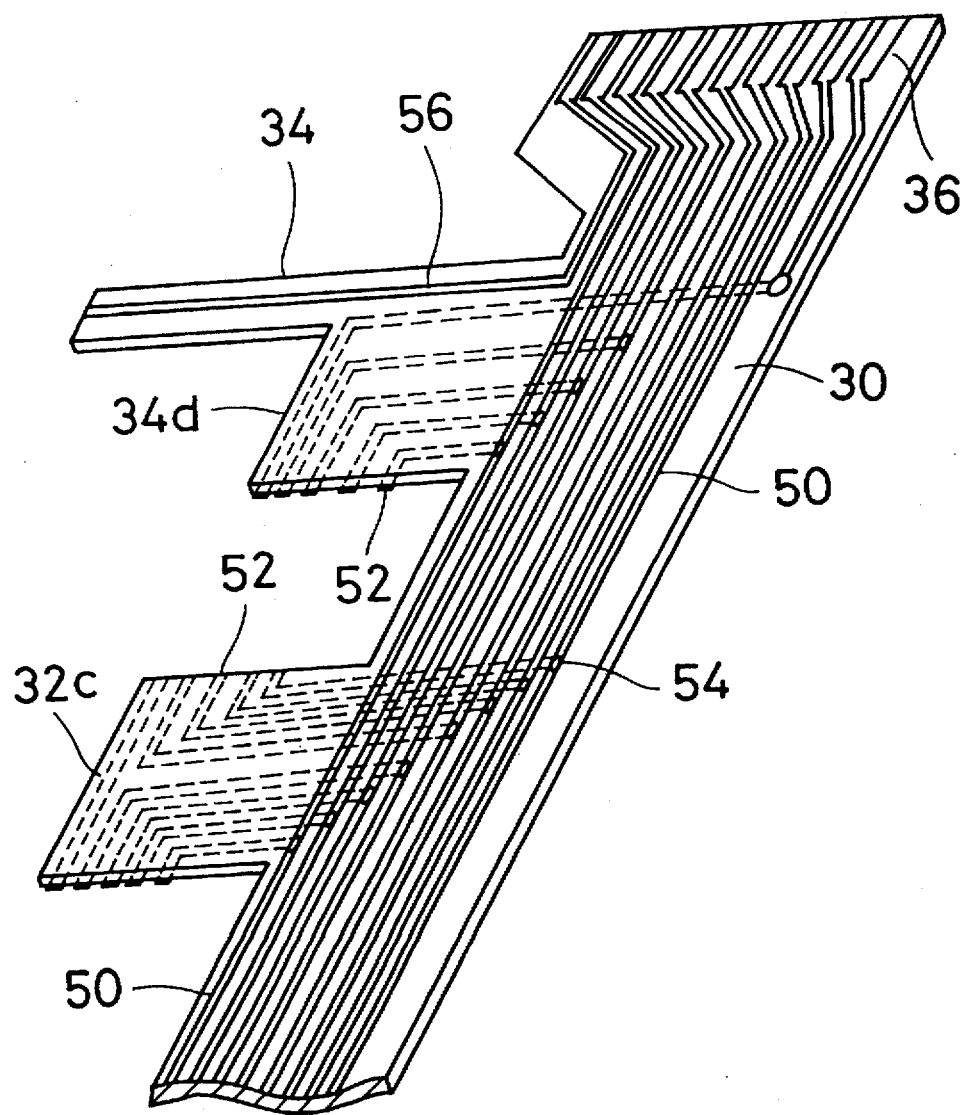
FIG. 9 is a perspective view of a modification of the flexible substrate of the first embodiment.

FIG. 9 shows a modification of the first embodiment wherein the area of the external connection region 36 is made larger than that in the first embodiment to facilitate connection to external circuits and the like.

Figure 10:
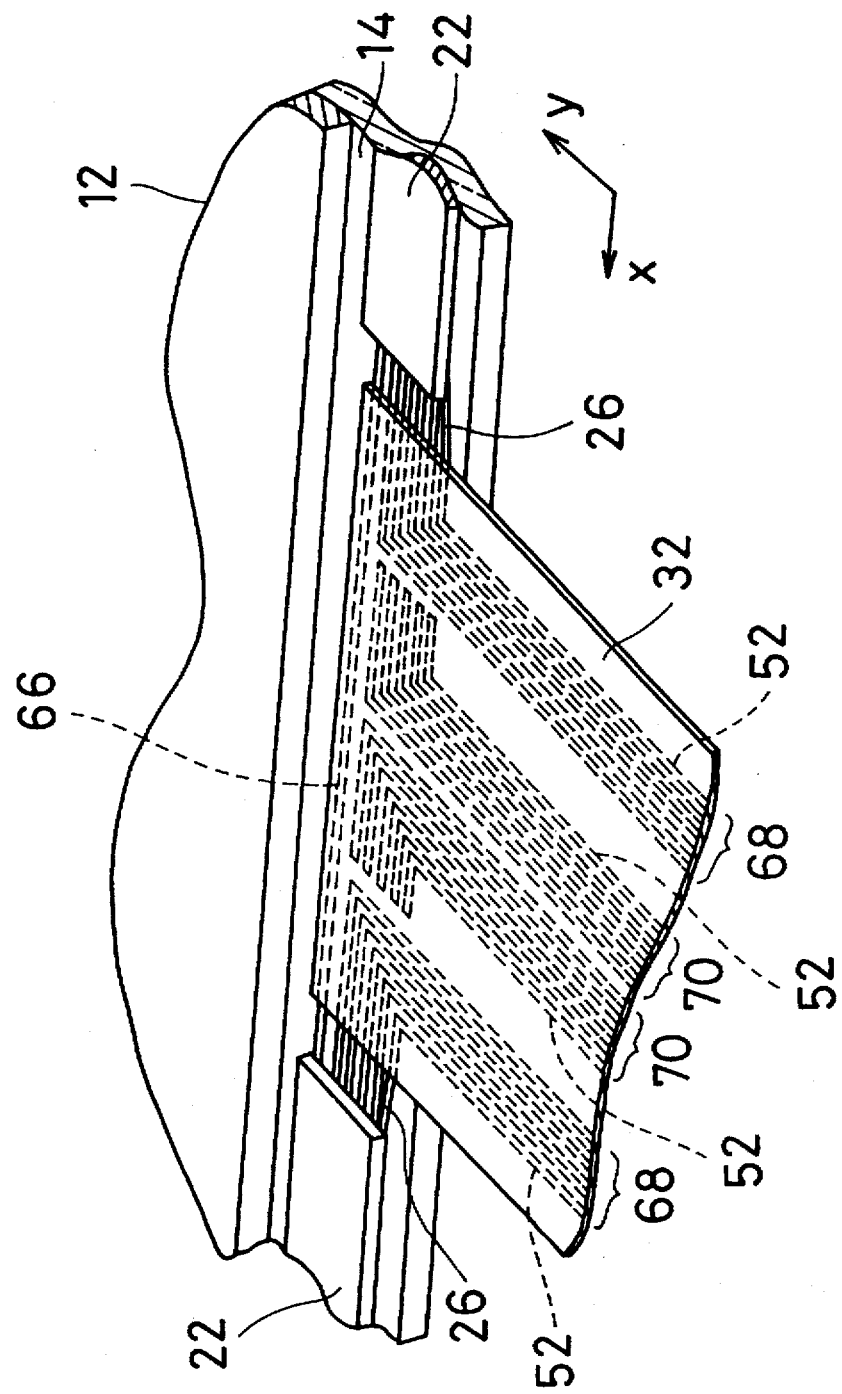
FIG. 10 is an enlarged perspective view of major parts of a liquid crystal display device according to a second embodiment of the present invention.

A second embodiment of the present invention will now be described with reference to FIGS. 10 through 12.

A liquid crystal display device 10 according to the second embodiment is different from the liquid crystal display device of the first embodiment in the arrangement of the pads 27 and the wiring structure of the branch lines 52 in the branch region 32.

First, the arrangement of the pads 27 will be described.

Figure 11:
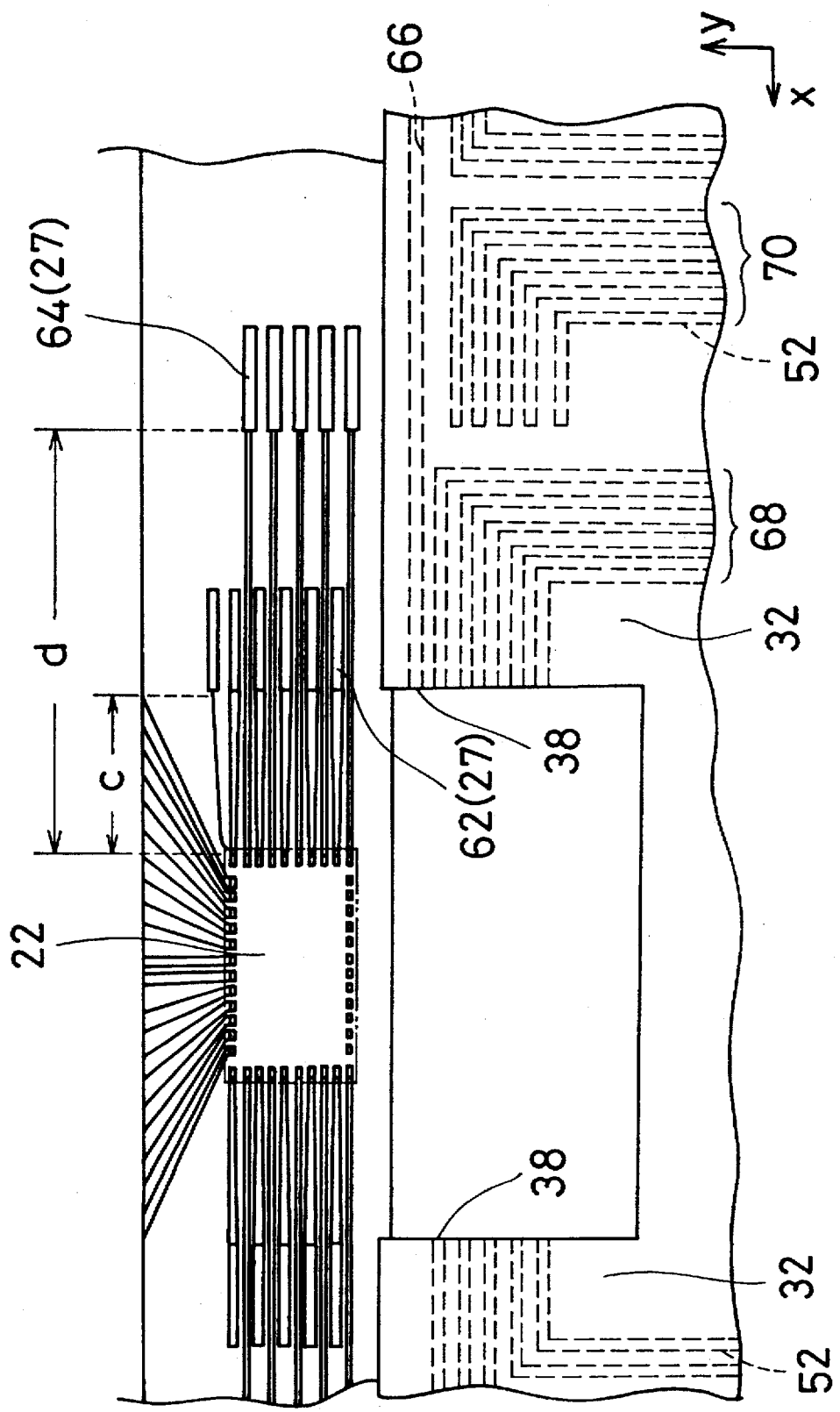
FIG. 11 is a plan view showing a state wherein the flexible substrate has been removed from the glass substrate in the second embodiment.

As shown in FIG. 11, the plurality of pads 27 form two groups of pads. The first group is provided at a distance "c" from the shorter sides of the X-side IC chips 22 and forms a first group of pads 62. The second group is provided at a distance "d" (d>c) from the shorter sides and constitutes a second group of pads 64. A plurality of pads 27 belonging to the first group of pads 62 and a plurality of pads 27 belonging to the second group of pads 64 are alternately provided as shown in FIG. 11.

This arrangement prevents the pads 27 from short-circuiting with each other even if a number of lead wires 26 increases corresponding to the X-side IC chips 22 having a plurality of input terminals. It is therefore possible to make the intervals between the pads 27 small. For example, the width of a lead wire 26 is 30 μm while the width of a pad 27 is 70–80 μm. The interval between adjoining pads is 150 μm, which allows the pads 27 to be provided in a density one times higher than in the first embodiment.

Next, the branch lines 52 in the branch regions 32 will be described.

Figure 12:
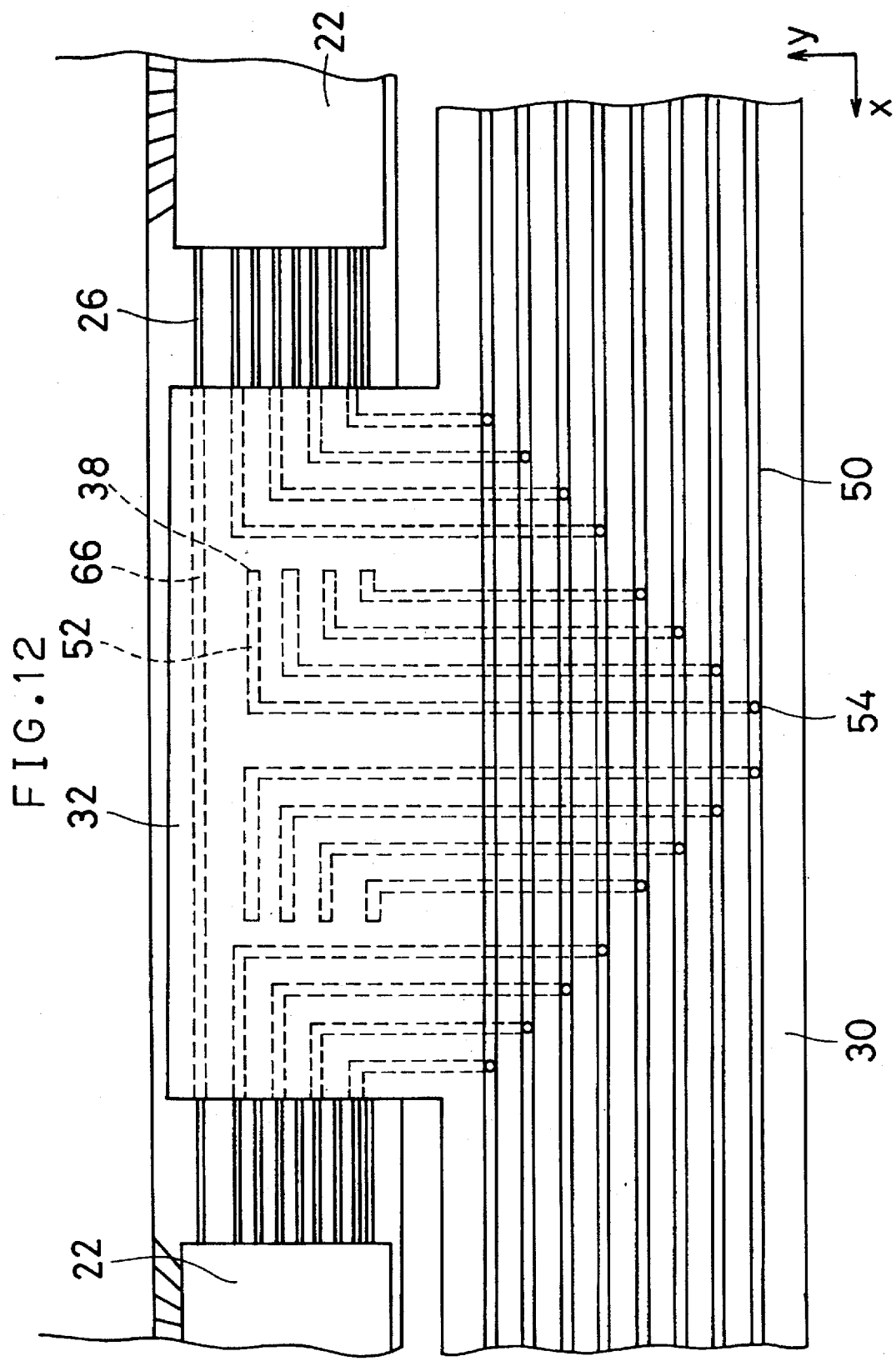
FIG. 12 is a plan view showing a state wherein the flexible substrate is mounted on the glass substrate.

As shown in FIG. 12, the branch lines 52 branch from the main lines 50 in the main region 30 into two groups, i.e., a first group of branch lines 68 and a second group of branch lines 70 and are provided in the direction in which the branch region 32 extends, i.e., in the y-direction. Each of the first group of branch lines 68 and the second group of branch lines 70 is bent toward the X-side IC chips 22, and a terminal 38 is provided at the end of each of them. The positions of the terminals 38 of the first group of branch lines 68 and the second group of branch lines 70 correspond to the positions of the first group of pads 62 and the second group of pads 64, respectively.

The reference number 66 designates a link line for electrically connecting the X-side IC chips 22 in the branch region. The link line is used for transmitting a start pulse between the chips 22.

Figure 13:
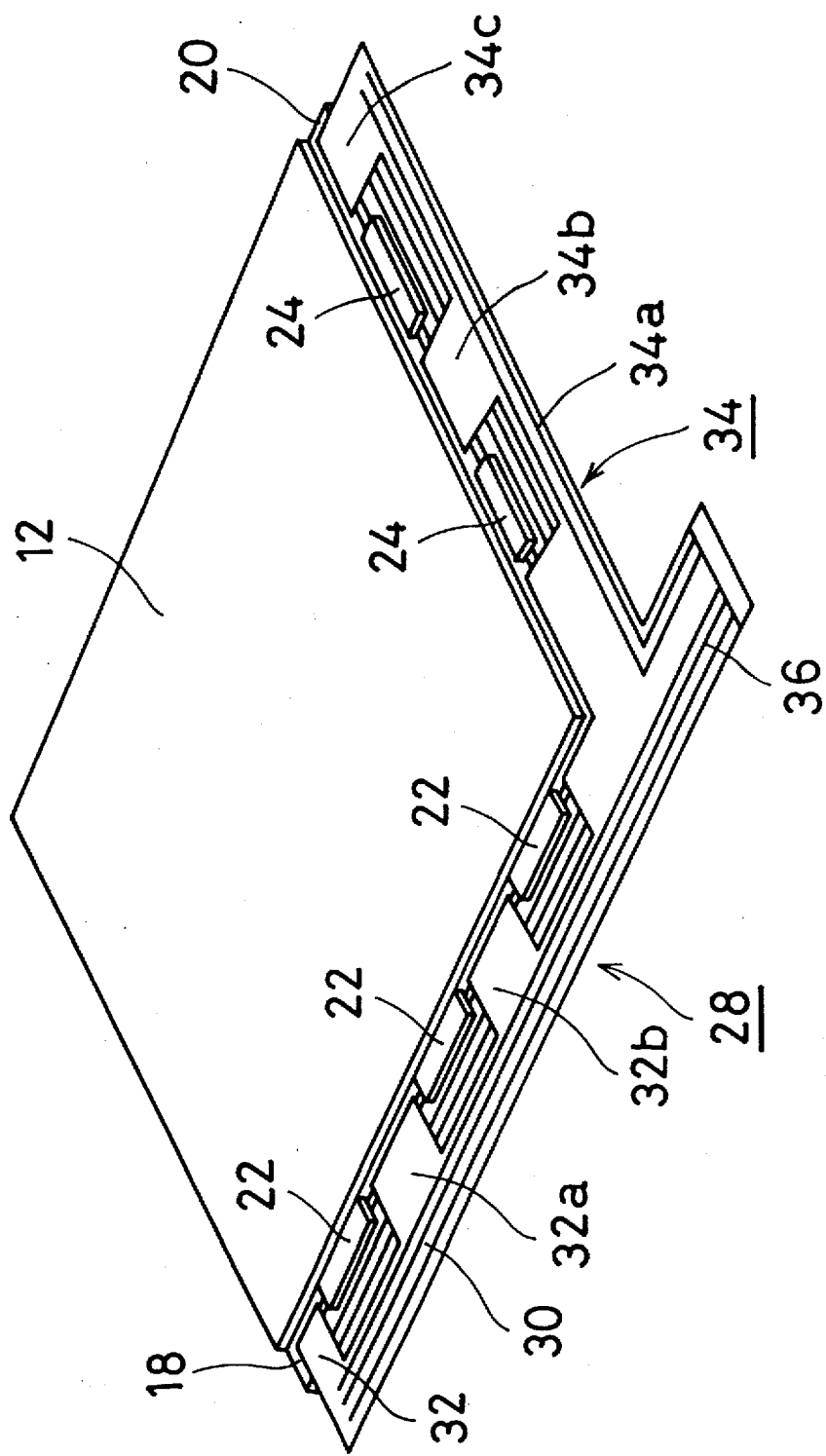
FIG. 13 is a perspective view of a liquid crystal display device according to a third embodiment of the present invention.
Figure 14:
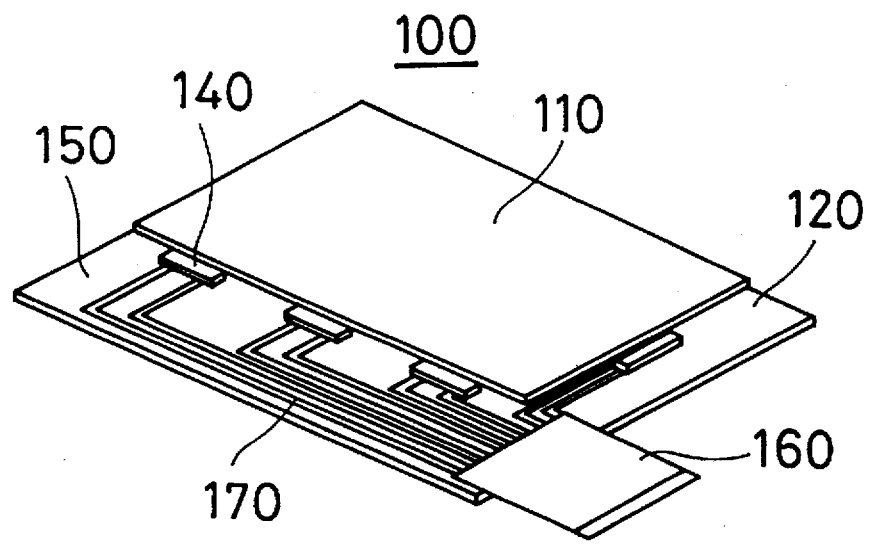
FIG. 14 is a perspective view of a first liquid crystal display device according to the prior art.
Figure 15:
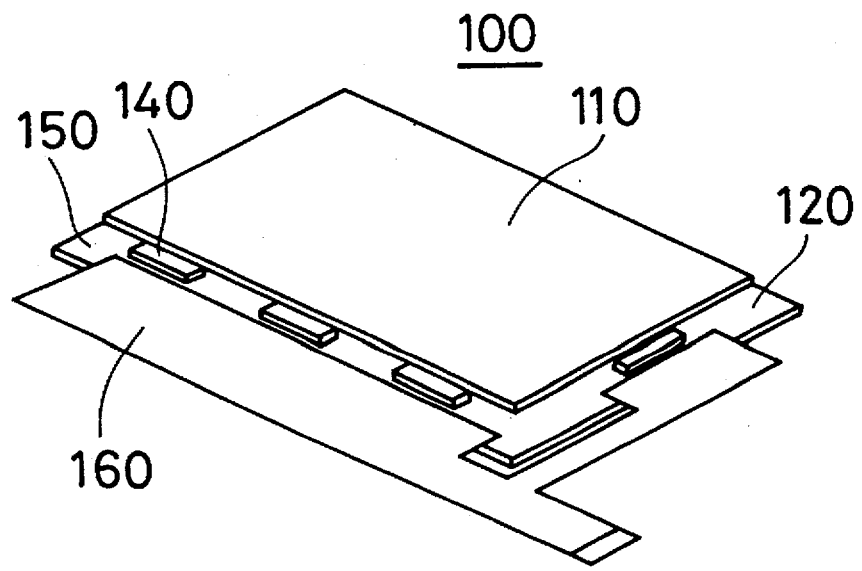
FIG. 15 is a perspective view of a second liquid crystal display device according to the prior art.
Figure 16:
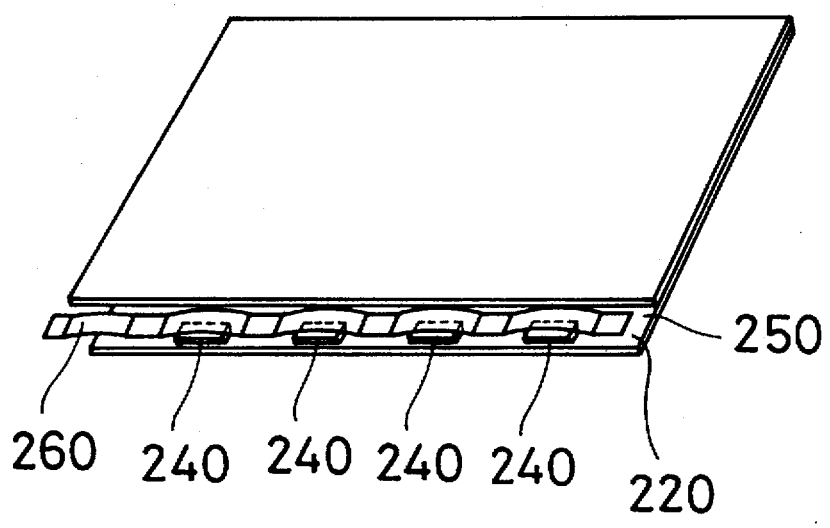
FIG. 16 is a perspective view of a third liquid crystal display device according to the prior art.

As shown in FIGS. 12 and 13, such an arrangement places the branch region 32 between the X-side IC chips 22 and allows the terminals 38 positioned at the ends of the branch lines 52 to be easily electrically connected to the pads 27.

The above-described first group of pads 62, second group of pads 64, and the respective lead wires 26 can be formed at the same time when the scan lines and signal lines are formed. Those elements may be formed in separate layers, for example, by forming the first group of pads 62 and the lead wires 26 connected thereto simultaneously with the signal lines and forming the second group of pads 64 and the lead wires 26 connected thereto simultaneously with the scan lines to prevent short circuits between pads and the like that can occur if they are provided in a single layer.

A liquid crystal display device 10 according to a third embodiment of the present invention will now be described with reference to FIG. 13.

The present embodiment is different from the first embodiment in that two Y-side IC chips 24 are provided at the Y-side peripheral portion 20 just as those at the X-side peripheral portion 18 and in that, as a result, the gate line substrate 34 is formed by a main region 34a and branch regions 34b and 34c which project from the main region 34a.

The branch region 34b is positioned between the Y-side IC chips 24, and pads 27 connected to the Y-side IC chips 24 are electrically connected to a terminal at the branch region 34b.

In this case, the width of the Y-side peripheral portion 20 can be substantially equal to the width of the mounting area of the Y-side IC chips 24 even though the number of the Y-side IC chips 24 has been increased.

It is therefore possible to minimize the widths of the X-side peripheral portion 18 and Y-side peripheral portion 20, thereby reducing the external size of the liquid crystal display device 10.

In the above-described embodiments, the flexible substrate 28 is formed to have the main region 30 and the branch regions 32 on the side of the X-side peripheral portion 18 because a plurality of X-side IC chips 22 are provided. If a plurality of IC chips, i.e., Y-side IC chips 24 are provided only at the Y-side peripheral portion 20 alternatively, the flexible substrate 28 may be formed to have the main region 30 and branch regions 32 on the Y-side only.

Although electrical connection between IC chips and electrical connection to external circuits or the like are both provided by various lines on the flexible circuit 28 in the above-described embodiments, signals such as start pulse signals and image data which are less susceptible to the resistance of wiring may be transferred using thin film lines formed on the substrate simultaneously with the signal lines and scan lines.

Further, the IC chips in the above embodiments may be formed integrally with the substrate at the same time when TFT's are formed.

Moreover, although the above-described embodiments have been described with reference to liquid crystal display devices, the present invention is not limited thereto and may be applied to plasma displays and the like.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A display device comprising:
    a display panel;
    a plurality of driving circuit portions provided along at least one side of said display panel, said display panel including a plurality of pads electrically connected to one of said driving circuit portions and disposed between said one of said driving circuit portions and another driving circuit portion;
    a wiring substrate for supplying a drive signal to said driving circuit portions, said wiring substrate including a main region extending along the periphery of said one side of said display panel and a branch region extending from said main region and between said one of the driving circuit portions and said another driving circuit portion;
    a group of main lines constituted by a plurality of main lines is provided in said main region; and
    a branch line connected to at least one of the main lines is provided in said branch region, said branch region including a terminal electrically connected to said branch line and disposed between a position associated with said pads.

2. A display device according to claim 1, wherein:
    said display panel comprises a plurality of pixel electrodes disposed through switching devices connected to signal lines and scan lines and in that said driving circuit portions are connected to at least one of said signal lines.

3. A display device according to claim 1, characterized in that said display panel comprises a plurality of pixel electrodes disposed through switching devices connected to signal lines and scan lines and in that said driving circuit portions are connected to at least one of said scan lines.

4. A display device according to claim 1, wherein:
    said plurality of pads are arranged in the direction in which said branch region of said wiring substrate extends.

5. A display device according to claim 1, wherein:
    said plurality of pads are two-dimensionally interspersed.

6. A display device according to claim 1, wherein:
    said plurality of pads form two or more groups of pads arranged in the direction in which said branch region extends.

7. A display device according to claim 1, wherein:
    said plurality of pads are arranged at a predetermined angle to the direction in which said branch region extends.

8. A display device according to claim 1, wherein:
    a part of said plurality of pads are disposed at a predetermined distance from said driving circuit portions and the remainder of said plurality of pads are disposed at a distance from said driving circuit portions different from said predetermined distance.

9. A display device according to claim 1, wherein:
    said plurality of terminals associated with said plurality of pads form two or more groups of terminals arranged in the direction in which said branch region extends.

10. A display device according to claim 1, wherein:
    an insulation layer is interposed between said branch line in said branch region and said main lines in said main region.

11. A display device comprising:
    a display panel;
    a first driving circuit portion provided along one side of said display panel;
    a second driving circuit portion provided along another side of said display panel adjacent to said side; and
    a wiring substrate for supplying a drive signal to each of said first and second driving circuit portions, said wiring substrate including:
    a first main region extending along the said one side of the display panel,
    a second main region extending along said another side,
    a first branch region extending from said first main region in a direction substantially perpendicular to said one side and electrically connecting with said first driving circuit portion; and
    a second branch region extending from said second main region in a direction substantially perpendicular to said another side and electrically connecting with said second driving circuit portion.

12. A display device according to claim 11, wherein said display panel comprises a plurality of pads electrically connected to said first driving circuit portion, said display device further comprising:
    a group of main lines constituted by a plurality of main lines is provided in said first main region of said wiring substrate;
    a branch line electrically connected to at least one of said main lines is provided in said first branch region; and
    said branch line comprises a terminal electrically connected to said branch line and disposed in a position associated with said pads.

13. The display device according to claim 1 or 11, wherein each of said driving circuit portions comprises:
an IC chip, said IC chip including:
connection bumps arranged along each side of one substantially square principal surface thereof for outputting drive signals and control signals based on input signals including control signals;
a plurality of first bumps arranged along one side of said principal surface, for outputting the drive signals;
a plurality of second bumps arranged along a side adjacent to said side, for inputting the input signals; and
a plurality of third bumps arranged along another side adjacent to the said side, for outputting the control signals.

14. An IC chip according to claim 13, wherein a plurality of fourth bumps arranged along the side opposite to said side are dummy bumps.

15. A display device comprising:
a display panel;
at least first driving circuit portions and second driving circuit portions provided along at least one side of the display panel;
a wiring substrate for supplying a drive signal to the first driving circuit portions and the second driving circuit portions;
a first pad group consisting of a plurality of pads electrically connected to the first driving circuit portions; and
a second pad group consisting of a plurality of pads electrically connected to the second driving circuit portions;
wherein, the first pad group and the second pad group are disposed between the first driving circuit portions and the second driving circuit portions; and
wherein the wiring substrate comprises:
a main region extending along the periphery of the one side of the display panel;
a branch region extending from the main region and between the first driving circuit portions and the second driving circuit portions;
a group of main lines constituted by a plurality of main lines provided in the main region;
a branch line arranged in the branch region, one end of the branch line being electrically connected to at least one of the main lines, and another end of the branch line being electrically connected to a terminal associated with at least one of the pads of the second pad group; and
a connecting line arranged in the branch region, one end of the connecting line including a terminal associated with at least one of the pads of the first pad group, and another end of the connecting line including a terminal associated with at least one of the pads of the second pad group.

16. A display device comprising:
a display panel;
at least first driving circuit portions and second driving circuit portions provided along at least one side of the display panel;
a wiring substrate for supplying a drive signal to the first driving circuit portions and the second driving circuit portions;
a first pad group consisting of a plurality of pads electrically connected to the first driving circuit portions; and
a second pad group consisting of a plurality of pads electrically connected to the second driving circuit portions;
wherein, the first pad group and the second pad group are disposed between the first driving circuit portions and the second driving circuit portions; and
wherein said wiring substrate comprises:
a main region extending along the periphery of the one side of the display panel;
a branch region extending from the main region and between the first driving circuit portions and the second driving circuit portions;
a group of main lines constituted by a plurality of main lines provided in the main region; and
a branch line arranged in the branch region, one end of the branch line being electrically connected to at least one of the main lines, and another end of the branch line being electrically connected to a terminal associated with at least one of the pads of the second pad group, the branch line intersecting at least one of the main lines with an insulator layer therebetween.

17. The display device according to claim 15 or 16, wherein each of said driving circuit portions comprises:
an IC chip, the IC chip including:
connection bumps arranged along each side of one substantially square principal surface thereof for outputting drive signals and control signals based on input signals including control signals;
a plurality of first bumps arranged along a first side of the principal surface, for outputting the drive signals;
a plurality of second bumps arranged along a second side that is adjacent to the first side, for inputting the input signals; and
a plurality of third bumps arranged along a third side that is adjacent to the first side, for outputting the control signals.

18. The display device according to claim 17, wherein said IC chip further comprises:
a plurality of fourth bumps arranged along a fourth side that is opposite to the first side, wherein the fourth bumps are dummy bumps.

* * * * *